United States Patent
Ahmed et al.

(10) Patent No.: US 6,883,021 B2
(45) Date of Patent: Apr. 19, 2005

(54) PROGRAMMABLE AND MULTIPLIERLESS VITERBI ACCELERATOR

(75) Inventors: Zaheer Ahmed, Islamabad (PK); Shoab A. Khan, Rawalpindi (PK)

(73) Assignee: Quartics, Inc., Irvine, CA (US)

( * ) Notice: Subject to any disclaimer, the term of this patent is extended or adjusted under 35 U.S.C. 154(b) by 606 days.

(21) Appl. No.: 09/951,348

(22) Filed: Sep. 10, 2001

(65) Prior Publication Data

US 2002/0095639 A1 Jul. 18, 2002

Related U.S. Application Data

(60) Provisional application No. 60/231,255, filed on Sep. 8, 2000.

(51) Int. Cl.[7] ............................................. G06F 15/167
(52) U.S. Cl. ....................................................... 709/213
(58) Field of Search .......................... 711/147; 709/213; 375/341; 714/795

(56) References Cited

U.S. PATENT DOCUMENTS

| | | | | |
|---|---|---|---|---|
| 5,220,570 A | * | 6/1993 | Lou et al. | 714/791 |
| 5,432,804 A | * | 7/1995 | Diamondstein et al. | 714/795 |
| 5,454,014 A | * | 9/1995 | Blaker et al. | 375/341 |
| 5,748,650 A | * | 5/1998 | Blaker et al. | 714/786 |
| 5,960,011 A | * | 9/1999 | Oh | 714/789 |
| 6,690,750 B1 | * | 2/2004 | Hocevar et al. | 375/341 |
| 2001/0009569 A1 | * | 7/2001 | Kang et al. | 375/242 |
| 2002/0141487 A1 | * | 10/2002 | Bradley | 375/148 |

* cited by examiner

Primary Examiner—Hiep T. Nguyen
(74) Attorney, Agent, or Firm—Patent Metrix (57) ABSTRACT

The invention is related to methods and apparatus that decode convolutionally encoded data, including trellis-coded modulation (TCM) systems. One embodiment of the invention shares a memory device with a main processor, such as a microprocessor or a DSP, and advantageously relieves the main processor of the relatively time-consuming task of decoding the convolutionally encoded data. This frees up the main processor to execute other tasks. One embodiment of the invention includes a micro-coded state machine that can be programmed to control the decoding of the convolutional codes.

22 Claims, 9 Drawing Sheets

PROGRAMMABLE AND MULTIPLIERLESS VITERBI ACCELERATOR

RELATED APPLICATION

This application claims the benefit under 35 U.S.C. § 119(e) of U.S. Provisional Application No. 60/231,255, filed Sep. 8, 2000, the entirety of which is hereby incorporated by reference.

BACKGROUND OF THE INVENTION

1. Field of the Invention

The invention generally relates to electronic communications systems. In particular, the invention relates to Viterbi decoding.

2. Description of the Related Art

Forward error correction (FEC) techniques are often used in communication systems in order to enhance the reliability of the transmitted signal and to improve the capacity of a data channel. A forward error correction (FEC) encoder encodes input bits to output symbols. The output symbols contain redundancy, which allow a decoder to recover the original input bits even when the output symbols are transmitted in the presence of interference or noise, and thus tolerate the occasional corruption of output symbols. A related forward error correction technique is convolutional coding. Another forward error correction technique is trellis-coded modulation (TCM).

With convolutional coding, input bits are provided to an encoder and mapped by the encoder to output symbols. The mapping by the encoder depends on the code rate and the constraint length. The code rate k/n corresponds to the ratio of input bits k to output symbols n. Thus, the encoder produces n output symbols for k input cycles. The constraint length K corresponds to the number of input bits that determine the state or value of an output symbol. Thus, for a given constraint length K, an encoder will typically store K-1 states of the input signal and combine these K-1 states with the present state of the input signal to specify the output symbol. The output symbols are constrained according to the Boolean logic characteristics of the encoder. The value of K-1 is referred to as m or the memory length of the encoder.

The values for the code rate k/n and the constraint length K can vary in a broad range and are selected according to the requirements of the communication system. An example of a code rate k/n is 1/2. An example of a constraint length K is 7. Where the modulation technique used to transmit an encoded output symbol is the same as the modulation technique that would have been used to transmit an unencoded input bit, convolutional coding increases the bandwidth required to transmit information by the inverse of the code rate. However, the benefits of error correction and the advantages of transmitting information with less power overcome these disadvantages.

Convolutional codes with relatively high code rates k/n can be constructed by puncturing or removing coded symbols from a relatively low code rate convolutional code. Puncturing techniques do not affect the performance of the convolutional code significantly, and yet, puncturing techniques can increase the data rate of the convolutional code when transmitted in a bandwidth limited channel. Puncturing techniques further simplify decoding of the encoded symbols.

With trellis-coded modulation (TCM), error correction coding and modulation are combined. Trellis-coded modulation is used in many applications including relatively high data rate dialup modem standards such as CCITT V.34 communications, CCITT V.90 communications, CCITT V.92 communications, and the like, all from the International Telecommunication Organization (ITU). With trellis-coded modulation, the error correction coding corresponds to a selected convolutional code and the modulation scheme is selected from a modulation scheme such as quadrature amplitude modulation (QAM) or phase shift keying (PSK). With trellis-coded modulation, every point in the modulation constellation is mapped by a convolutional code. Moreover, the selection of the convolutional code mapping maximizes the squared Euclidean distance between distinct symbols, thereby maximizing the noise immunity of a trellis-coded modulation system. Set partitioning techniques are used to determine the convolutional code mapping.

Although convolutional coding can be implemented relatively simply, decoding is more difficult as the path taken in coding the input signal is not known until the encoded symbols are decoded. Convolutional codes can be decoded at a receiver by a variety of techniques. One such decoding technique is Viterbi decoding, where the convolutional code is decoded in accordance with a maximum likelihood decoding algorithm known as the Viterbi algorithm. With each received symbol, a Viterbi decoder computes metrics of the likelihood for all the paths that could have been taken by the encoder. A conventional Viterbi decoder traces back about several times the constraint length K of the encoder in order to compute the likelihood of a path. The trace back depth can also vary with the code rate, and can be selected within a relatively broad range by the designer. To decode the encoded symbol stream, the Viterbi decoder selects the path calculated to be the most likely path, which is known as the surviving path.

In many conventional systems, such as modems, receivers, mobile telephones, satellite communications systems, and the like, a host processor such as a general purpose microprocessor or a general purpose digital signal processor (DSP) decodes the convolutional code or decodes the trellis-coded modulation. Disadvantageously, the execution of a Viterbi decoding algorithm can be a relatively time-consuming process and can consume a relatively large amount of the host processor's time. When the host processor is executing the Viterbi decoding algorithm, many of the host processors functional blocks remain idle. This is a waste of valuable host processor resources. What is needed is a technique to alleviate the host processor from the burden of Viterbi decoding, thereby freeing the host processor to perform other tasks.

SUMMARY OF THE INVENTION

The invention solves these and other problems by providing a Viterbi Accelerator that can stand alone or can interface with a host processor to perform Viterbi decoding. In one embodiment, the Viterbi Accelerator is programmable and multiplierless. The decoding by the Viterbi Accelerator advantageously frees a host processor from having to perform the time-consuming process of decoding the incoming messages, thereby allowing the host processor to advantageously dedicate its resources to other processes. It will be understood by one of ordinary skill in the art that the techniques disclosed herein can be combined with other communications systems techniques such as bit interleaving, concatenation, Reed-Solomon coding, and the like.

The invention is related to methods and apparatus that decode convolutionally encoded data, including trellis-coded modulation (TCM) systems. One embodiment of the invention shares a memory device with a main processor, such as a microprocessor or a DSP, and advantageously relieves the main processor of the relatively time-consuming task of decoding the convolutionally encoded data. This frees the main processor to execute other tasks. One embodiment of the invention includes a micro-coded state machine that can be programmed to control the decoding of the convolutional codes.

Embodiments of the invention include an apparatus and methods for decoding convolutional codes with a Viterbi algorithm. The apparatus and methods include normalizing constellations of received data, calculating path metrics with one add-compare-select unit, selecting paths with the lowest metrics, and thereby decoding the convolutionally coded data.

One embodiment of the invention includes a communications peripheral, such as a modem, which is adapted to transfer data from one system to another. The data is convolutionally coded as found in trellis-coded modulation (TCM). The communications peripheral can include interfaces to the systems, such as an interface to a phone line and an interface to a host computer. A codec converts the encoded data from the remote system to a digital form, which is read by a host processor such as a digital signal processor (DSP). Rather than decode the encoded data, the host processor writes the encoded data to memory. A Viterbi Accelerator also has access to the memory. The Viterbi Accelerator accesses the memory to retrieve the encoded data, decodes the encoded data in accordance with the Viterbi algorithm, and stores the decoded data in the memory to make the data available to the host processor. This advantageously allows the host processor to execute other tasks in parallel with the decoding of the convolutional data by the Viterbi Accelerator. One embodiment further includes a bus arbiter, which provides the host processor with higher priority access to the memory.

One embodiment of the invention includes a decoder that decodes convolutionally encoded data. The decoder includes an interface circuit that enables the decoder to share a memory device with a host processor. The decoder also includes a decoding circuit that executes a Viterbi algorithm to decode encoded data stored in the memory device. The decoder further includes configuration registers, which can be programmed to control the execution of the Viterbi algorithm.

One embodiment according to the invention includes a method of decoding convolutionally encoded data, where a main processor, such as a DSP, receives the convolutionally encoded data and stores the convolutionally encoded data in a memory device. The main processor activates a coprocessor to decode the convolutionally encoded data. When the convolutionally encoded data is decoded, the coprocessor stores the decoded data in the memory device to be read by the DSP. In one embodiment, the coprocessor sets an interrupt to inform the DSP of the availability of the decoded data. One method further includes a depuncturing process to supplement the encoded data with null symbols or with relatively low value numbers to replace the punctured codes.

One embodiment includes a method of providing data decoded from convolutionally encoded data. The method receives the location of the convolutionally encoded data, such as by receiving a memory pointer. The method further retrieves the convolutionally encoded data, applies the Viterbi algorithm to decode the convolutionally encoded data, stores the decoded data, and sets an interrupt to indicate the readiness of the decoded data. One embodiment further depunctures the convolutionally encoded data by providing null symbols and the like in accordance with a depuncturing pattern.

One embodiment includes a method of configuring a decoder that decodes convolutionally decoded data. The method receives an indication of a code rate, a constraint length, and a puncturing pattern of the convolutionally decoded data to be decoded. In response to the indication, the method programs a micro-coded state machine that controls a Viterbi algorithm implemented by the decoder.

One embodiment of the invention includes a programmable and multiplierless accelerator including a microcoded state machine and a folded add-compare-select unit.

One embodiment of the invention includes a method of decoding convolutional codes using a Viterbi algorithm including normalizing constellations of received data, calculating path metrics using a first add-compare-select unit, and decoding the received data without trace-back.

One embodiment of the invention includes a compact Viterbi decoder including means for normalizing constellations of received data, means for computing path metrics iteratively, and means for decoding data without trace-back.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the invention is defined only by reference to the appended claims.

Figure 1A:
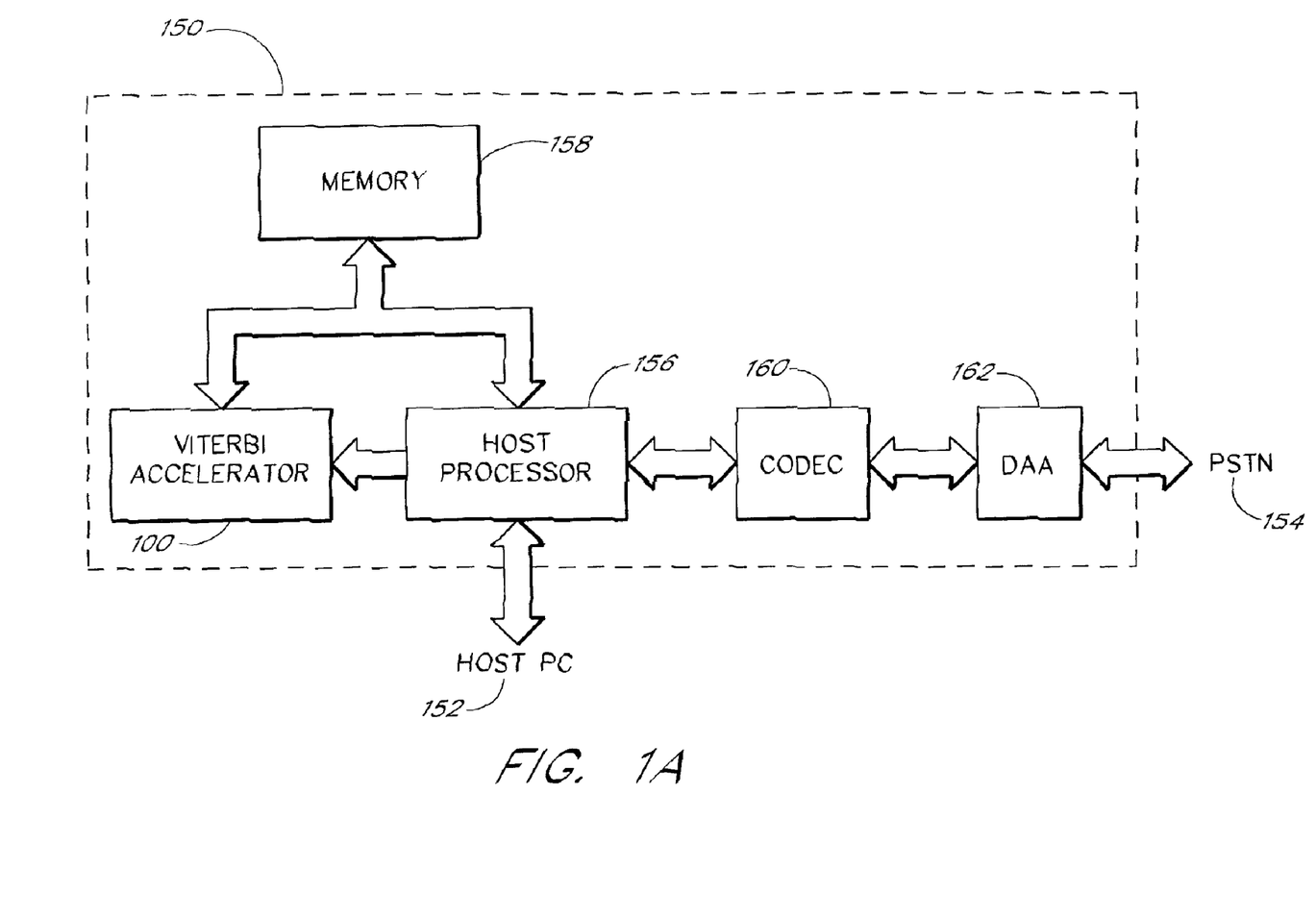
FIG. 1A illustrates a modem using a Viterbi Accelerator.

FIG. 1A illustrates one embodiment according to the invention of a modem 150, which advantageously uses a Viterbi Accelerator 100. The modem 150 is coupled to a host PC 152 and to a public switched telephone network (PSTN) 154, and allows the host PC 152 to communicate with other computers and the like via the public switched telephone network 154.

The illustrated modem 150 includes the Viterbi Accelerator 100, a host processor 156, a shared memory 158, a coder/decoder (codec) 160, and a Data Acquisition Arrangement (DAA) 162. In one embodiment, the host processor 156 is a controller, such as a microcontroller or a microprocessor. The host processor 156 manages communication with the host PC 152 and the modem 150. The host processor 156 performs tasks such as initialization of components of the modem 150, activation and deactivation of various components of the modem 150, dialing, compression of transmitted data, decompression of received data, and the like.

In another embodiment, the modem 150 is controllerless, and many of the functions that would have been performed by the host processor 156 implemented with a controller are performed instead by the host PC 152. In one embodiment, the host processor 156 is a digital signal processor (DSP).

The Viterbi Accelerator 100 interfaces with the host processor 156 in the illustrated embodiment of the modem 150, or with a DSP in an alternative embodiment. The Viterbi Accelerator 100 advantageously performs Viterbi decoding to decode the convolutional codes and the trellis-coded modulation (TCM), thereby alleviating the host processor 156 of this time consuming task.

The Viterbi Accelerator 100 can also include functions to encode bits from the host processor 156 or from the shared memory 158 to convolutional code or trellis-coded modulation (TCM). In one embodiment of the modem 150, the host processor 156 and the Viterbi Accelerator 100 transfer message information via the shared memory 158, which lowers the cost of the modem 150 and allows the host processor 156 and the Viterbi Accelerator 100 to operate independently of each other in parallel. In one embodiment, the Viterbi Accelerator 100 accesses the shared memory 158 when the host processor 156 is idle, i.e., by cycle stealing. Further details of one Viterbi Accelerator 100 according to an embodiment of the invention are described later in connection with FIGS. 1B, 2, 3A, and 3B.

In one embodiment, the host processor 156 receives encoded symbols from the codec 160, and arranges the symbols in the shared memory 158. The Viterbi Accelerator 100 decodes the encoded symbols and stores the decoded result back to the shared memory 158. The host processor 156 retrieves the decoded result and provides the decoded result as an input to the host PC 152. Further details of the operation of the host processor 156 and the Viterbi Accelerator 100 while decoding are described later in connection with FIGS. 4 and 5.

In one embodiment, the host processor 156 receives data to be transmitted from the host PC 152. The host processor 156 stores the data to be transmitted in the shared memory 158. The Viterbi Accelerator 100 accesses the shared memory 158 and performs convolutional coding on the data. The Viterbi Accelerator 100 stores the encoded symbols to the shared memory 158, where they are retrieved by the host processor 156 and provided as inputs to the codec 160 for transmission. It will be understood by one of ordinary skill in the art that in another embodiment, the host processor 156 rather than the Viterbi Accelerator 100 encodes the data to be transmitted with convolutional coding as convolutional coding is significantly simpler to compute than decoding of convolutional coded data.

The codec 160 converts the digital signals to and from the host processor 156 to analog signals for the Data Acquisition Arrangement 162. For example, where the analog signals on the public switched telephone network 154 are modulated in QAM, the codec 160 demodulates the QAM and provides the Viterbi Accelerator 100 with a digital representation of the QAM symbols. The Data Acquisition Arrangement 162 tunes the analog signals to and from the codec 160 and the public switched telephony network 154.

Figure 1B:
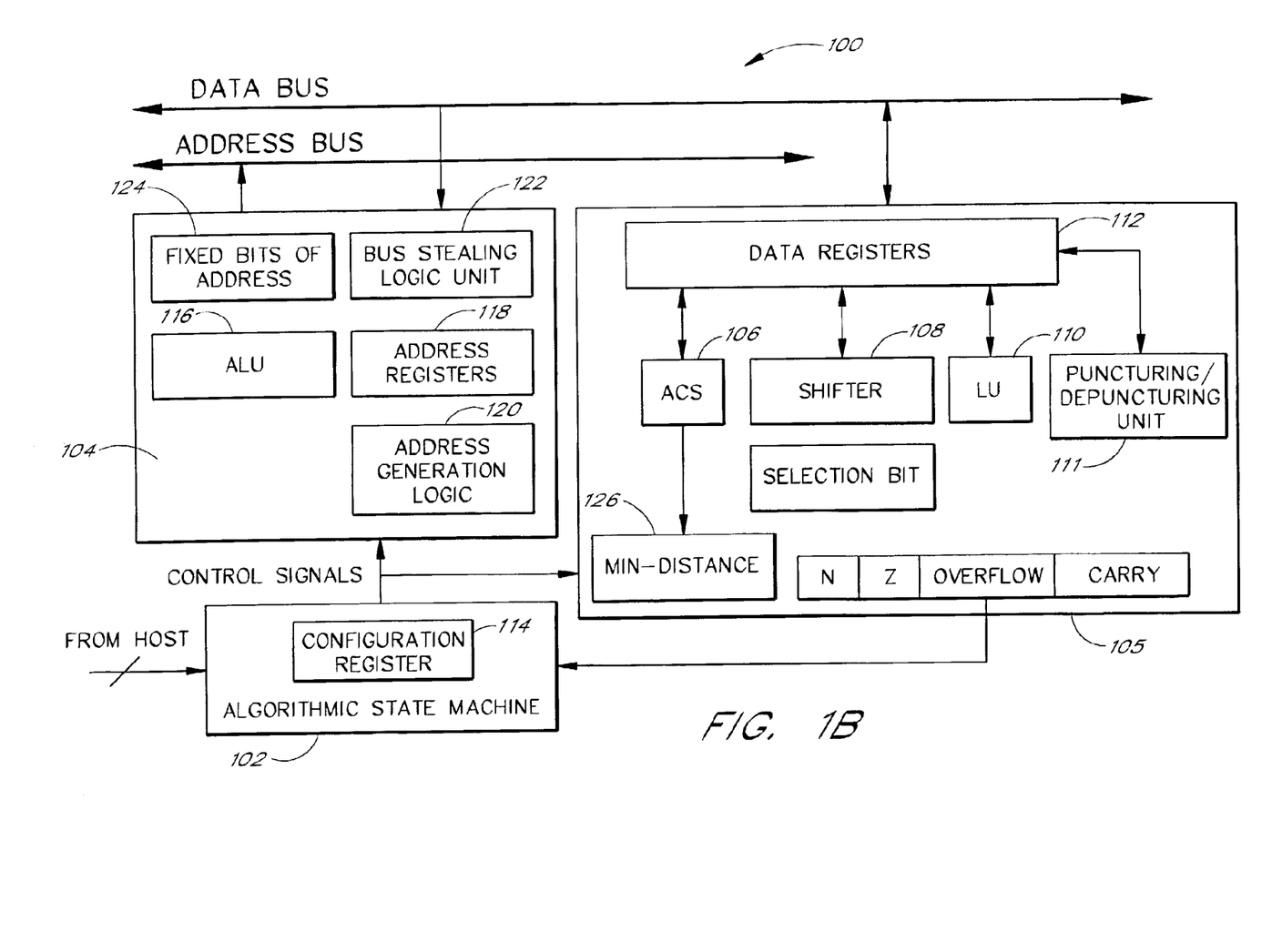
FIG. 1B illustrates a Viterbi Accelerator according to an embodiment of the invention.

FIG. 1B illustrates one embodiment according to the invention of the Viterbi Accelerator 100. The Viterbi Accelerator 100 includes an algorithmic state machine 102, an address generation unit 104, and a computational unit 105. The algorithmic state machine 102 further includes sequencer unit configuration registers 114 and Read Only Memory (ROM). The computational unit 105 further includes an Add-Compare-Select (ACS) unit 106, a shifter 108, a Logical Unit (LU) 110, a puncturing/depuncturing unit 111, and general purpose data registers 112.

In one embodiment, the Viterbi Accelerator 100 and the host processor 156 are configured in a Multiple Instruction Multiple Data (MIMD) architecture with shared memory. With the MIMD architecture, the Viterbi Accelerator 100 and the host processor 156 share data and address buses, thereby facilitating the transfer of information between the Viterbi Accelerator 100 and the host processor 156. In one embodiment, the data bus is 64-bits wide and the address bus is 32-bits wide. In one embodiment, the data bus is coupled to memory, such as the shared memory 158 described in connection with FIG. 1A, and the data bus carries data to and from the Viterbi Accelerator 100. In one embodiment, the Viterbi Accelerator 100 shares the data bus with a controller or a DSP, and the Viterbi Accelerator 100 accesses the data bus by cycle stealing. For example, in a system with a bus arbiter that manages access to a data bus, such as the data bus to the shared memory 158, the bus arbiter can be configured to grant the host processor 156 with higher priority access than the Viterbi Accelerator 100. The Viterbi Accelerator 100 and the host processor 156 can operate in parallel independently of one another.

The algorithmic state machine 102 generates control signals to control the operation of the Viterbi Accelerator 100. In one embodiment, the algorithmic state machine 102 is micro-coded, which allows the host processor 156, the host PC 152, or a user with interactive software on the host PC 152 to configure the behavior of the Viterbi Accelerator 100 by programming or updating state machine parameters. The algorithmic state machine 102 can be configured to select code rates (k/n), constraint lengths K, encoder polynomials, puncturing patterns, and the like. For example, the updating of parameters to the algorithmic state machine 102 can configure the Viterbi Accelerator 100 to encode and to decode in accordance with a relatively high speed modem standard such as CCITT V.90 communications from the ITU. In one embodiment, the programming or the updating of the parameters of the algorithmic state machine 102 is performed by firmware executing in the host processor 156.

A host, such as the host processor 156 described in connection with FIG. 1A, interfaces with the Viterbi Accelerator 100 through the configuration registers 114 in the algorithmic state machine 102. In one embodiment, the configuration registers 114 are memory mapped for access by the host processor 156. The host processor 156 can configure the Viterbi Accelerator 100 parameters such as encoder parameters, decoder parameters, or both by providing data mapped to the configuration registers 114. For example, code rates k/n, constraint lengths K, encoder polynomials, and puncturing patterns can be configured. In one embodiment, eight bits of a register in the configuration registers 114 specify the value of k, while another eight bits specifies the value of n. Similarly, address pointers for the Viterbi Accelerator 100 can also be addressed through memory mapping.

In one embodiment, the address pointers used by the computational unit 105 are configurable through data stored in memory. For example, the host processor 156 or the algorithmic state machine 102 can place address pointers in specified memory locations in memory. As the computational unit 105 executes, the computational unit 105 accesses these memory locations to retrieve the address pointers. In one embodiment, a relatively large number of registers are present in the computational unit 105 to avoid having to repeatedly load address pointers from memory. In one example, the address pointers are used to provide the starting addresses of the memory blocks used in the decoding process. In addition, the address pointers can include an accumulated error buffer pointer, a minimum path buffer pointer, 2D and 4D subset error buffer pointers, a symbol buffer pointer, and a decision queue buffer pointer.

One embodiment of the Viterbi Accelerator 100 includes a convolutional encoder. In one embodiment, the encoder polynomial implemented by the convolutional encoder can be selected by programming the polynomial coefficients in the configuration registers 114. In another embodiment, the host processor 156 can select a polynomial coefficients that have already been stored in the Viterbi Accelerator 100. As is well known to those in the art, a convolutional encoder includes a shift register and a plurality of modulo-2 adders. Typically, an exclusive-OR (XOR) gate is used to implement a modulo-2 adder. In one embodiment, the state of bits in a portion of the configuration registers 114 enables and disables the inputs to XOR gates and thereby configures the convolutional encoder. The states stored in the configuration registers 114 can also be used to determine which symbols are transmitted and which symbols, if any, are deleted or "punctured" for relatively high code rate encoding.

In one embodiment of the algorithmic state machine 102, the algorithmic state machine 102 includes a sequencer unit, Read Only Memory (ROM), and configuration registers 114. The configuration registers 114 can be used to store the programmed or updated parameters that configure the operation of the Viterbi Accelerator 100.

The sequencer unit further includes counters, a stack with a stack pointer, a conditional multiplexer, and an address register. The counters include a program counter for program execution, as well as other counters for implementing nested "FOR" loops and for implementing nested subroutines. The conditional multiplexer allows the sequencer unit to select a branch based on the status of a particular flag. The address register contains an immediate address of the ROM, which can be used as a starting address or for loading in some events. The algorithmic state machine 102 can execute both conditional and unconditional jump instructions.

The illustrated address generation unit 104 includes an Arithmetic Logic Unit (ALU) 116, a plurality of address registers 118, an address generation logic unit 120, a bus stealing logic unit 122, and a fixed address block 124. The bus stealing logic unit 122 monitors the address bus to determine when the access by the host processor 156 and the shared memory 158 is relatively idle and the Viterbi Accelerator 100 can "steal" bus cycles, i.e., access the shared memory 158 relatively unobtrusively. The Arithmetic Logic Unit (ALU) 116 performs a variety of logical functions such as incrementing, decrementing, offset addressing, indirect addressing, and modulo addressing to compute the addresses while the Viterbi Accelerates 100 accesses the shared memory 158. One embodiment of the address generation unit 104 is described in greater detail later in connection with FIG. 3A.

The computational unit 105 performs the decoding of convolutional codes in accordance with the Viterbi algorithm. The illustrated computational unit 105 includes the add-compare-select (ACS) unit 106, the shifter 108, the Logical Unit (LU) 110, a puncturing/depuncturing unit 111, and the general purpose data registers 112. One embodiment of the Add-Compare-Select (ACS) unit 106 is described in greater detail later in connection with FIG. 2.

The shifter 108 is configured to perform left shifts and right shifts. In one embodiment, the shifter 108 is a 64-bit shifter. The shifter 108 is coupled to a data bus internal to the Viterbi Accelerator 100. The general purpose data registers 112 can write data to the shifter 108, and can read shifted results from the shifter 108. The shifter 108 allows the Viterbi Accelerator 100 to multiply and to divide in powers of 2, which in combination with the adders and subtractors in the Add-Compare-Select (ACS) unit 106, allow one embodiment of the Viterbi Accelerator 100 to execute the Viterbi algorithm without the drawbacks, such as relatively large cost and expense, of a multiplier.

In one embodiment, the Logical Unit (LU) 110 is a 16-bit Logic Unit (LU) that performs logical operations such as AND, OR, XOR, and NOT operations. The puncturing/depuncturing unit 111 removes codes from convolutionally encoded data to increase the code rate of the data. The puncturing/depuncturing unit 111 also inserts null characters in encoded data prior to decoding with the Viterbi Algorithm. Rather than insert null characters, the puncturing/depuncturing unit 111 can insert an alternating sequence of relatively low values where punctured codes are detected. In one embodiment, the puncturing/depuncturing unit 111 inserts the lowest value number supported by the Viterbi Accelerator 100 and alternates between the positive value of the lowest value number and the negative value of the lowest value number in place of the punctured codes. One embodiment of a depuncturing unit is described in greater detail later in connection with FIG. 3B.

The general purpose data registers 112 interface with an address and data bus shared between the host processor 156 and the Viterbi Accelerator 100. The general purpose data registers 112 also interface with a data bus internal to the Viterbi Accelerator 100 to exchange data with other information blocks. Of course, the width of data transferred on the busses can vary in a broad range, such as 16, 32, 48 and 64 bits. In one embodiment, at least a portion of the general purpose data registers 112 store temporary data used in computations and the like. In one embodiment, immediate data can be stored in or read from the general purpose data registers 112 by the algorithmic state machine 102.

The computational unit 105 decodes the convolutional code in accordance with the Viterbi algorithm. The Viterbi algorithm is a maximum likelihood decoding algorithm. In the Viterbi algorithm, the computational unit 105 computes branch metrics for each possible branch in a trellis structure for each received signal. The branch or path with the highest likelihood, known as a survivor path, is selected and retained, and the other branches or paths are discarded. The survivor path, when traced back for a suitable number of time units, merges with the maximum likelihood path. The computational unit 105 stores the result of the best path selection for each state.

The computational unit 105 further includes a minimum distance unit 126, which calculates branch metrics for the computational unit 105. The minimum distance unit 126 maintains the metrics of each possible branch or path that could have been taken by the encoder. In one embodiment, the minimum distance unit 126 calculates the Hamming distance for each branch. The Hamming distance corresponds to a sum of the number of symbols by which code words differ. In another embodiment, the minimum distance unit 126 computes the Euclidean distance, i.e., the distance between sequences, to compute the branch metrics.

In one embodiment, the minimum distance unit 126 uses the Hamming distance for hard decision decoding and uses the Euclidean distance for soft decision decoding. Hard decision decoding corresponds to decoding with only one value for each received symbol. Soft decision decoding corresponds to decoding with an estimate of a value of each received symbol together with an indication of the reliability of the estimate. Thus, where the data is represented by a single bit, hard decision decoding is used. By contrast, where the data is represented with multiple-bit precision, soft decision decoding can be used. The skilled artisan will understand that soft decision decoding is advantageous because soft decision decoding provides about a 2.2 dB higher energy per bit to the spectral noise ratio ($E_b/N_0$) at the same bit-error level, thereby providing a signal to noise ratio advantage.

To compute the Hamming distance, the minimum distance unit 126 sums or counts the differences between the received data and the possible data for each branch or path.

To compute the Euclidean distance, the minimum distance unit 126 computes the local distance as shown in Equations 1, 2, and 3. The Euclidean distance for a code rate 1/n is expressed in Equation 1.

$$\text{local\_distance}(j) = \sum_{c=0}^{n-1} [SD_c - G_c(j)]^2 \qquad \text{Eq. 1}$$

In Equation 1, $SD_c$ is the soft-decision input, $G_c(j)$ is the expected inputs for each path state, j is an indicator of the path, and n is the inverse of the code rate. Equation 1 can be rewritten as Equation 2.

$$\text{local\_distance}(j) = \sum_{c=0}^{n-1} [SD_c^2 - 2SD_c G_c(j) + G_c^2(j)]^2 \qquad \text{Eq. 2}$$

To minimize the accumulation of errors, similar terms of the formula expressed in Equation 2 can be eliminated, thus reducing the formula expressed in Equation 2 to a sum of products of the received data and expected data values as expressed in Equation 3.

$$\text{local\_distance}(j) = -\sum_{c=0}^{n-1} SD_c G_c(j) \qquad \text{Eq. 3}$$

When the negative sign is removed from Equation 3, maximum values are searched for the metric update.

In a conventional circuit, a multiplier or a squarer is used to calculate the Euclidean distance. The multiplier or the squarer disadvantageously occupies a relatively large amount of space on a chip, which is costly. One embodiment of the Viterbi Accelerator 100 computes Euclidean distances without a multiplier and thereby advantageously occupies a relatively small amount of chip space. Instead of a multiplier, this embodiment of the Viterbi Accelerator 100 computes Euclidean distances with adders, subtractors, and shifters.

The Viterbi Accelerator 100 without a multiplier uses a normalized four-point constellation with points (1,1), (−1,1), (−1,−1), and (1,−1), or a normalized eight-point constellation with points (2,2), (1,2), (−1,2), (2,−1), (−2,−2), (−1,−2), (1,−2), and (2,−2). With a multiplierless architecture, branch metrics are calculated with additions and subtractions.

In another embodiment, the Viterbi Accelerator 100 calculates branch metrics by computing linear distance measurements between the received soft decision and the expected symbols. The computation of the linear distance has a smaller dynamic range than the squared Euclidean distance, but has similar performance to the squared Euclidean distance.

Figure 2:
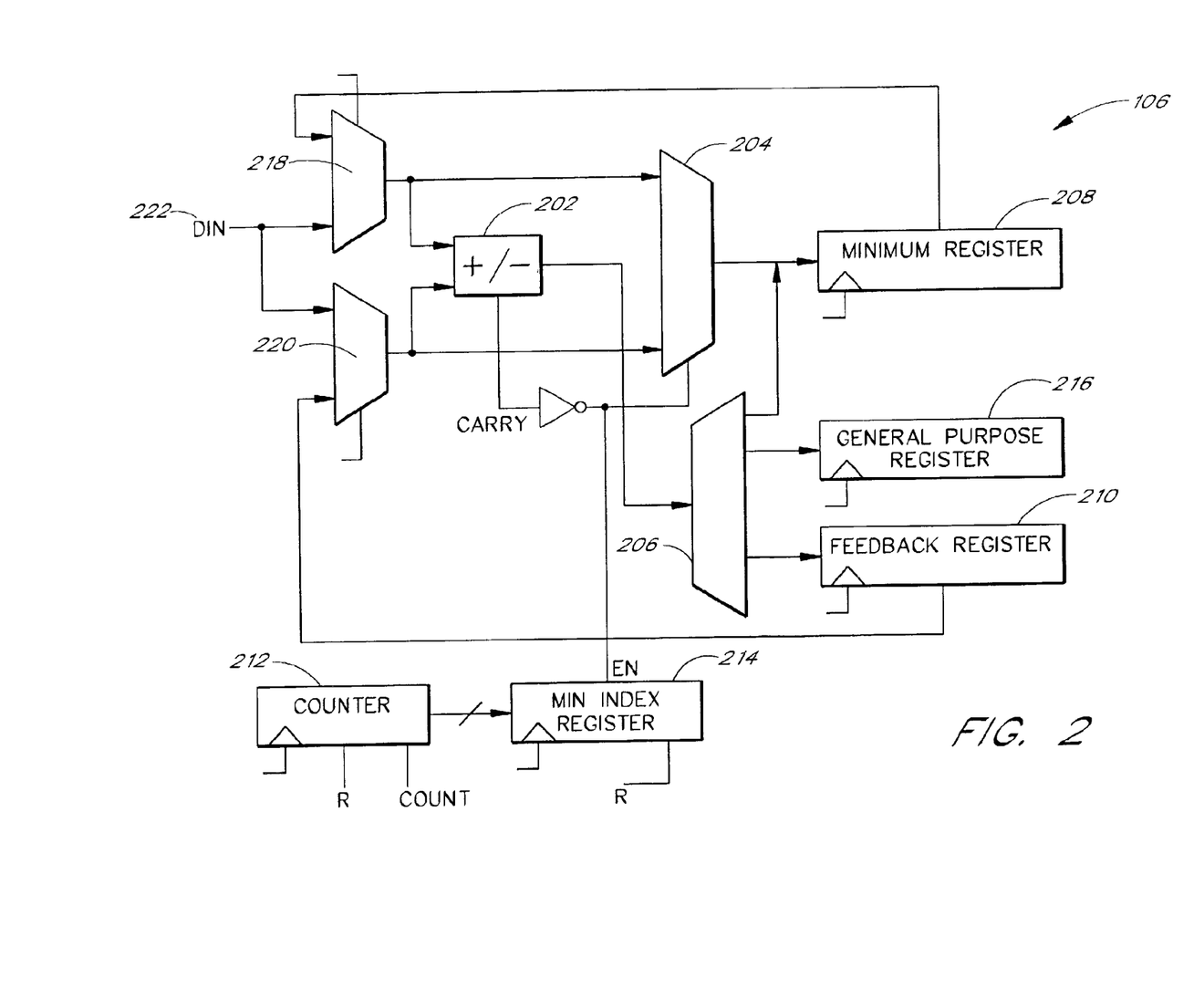
FIG. 2 is an Add Compare Select (ACS) unit according to one embodiment of the invention.

FIG. 2 illustrates one embodiment according to the invention of the add-compare-select (ACS) unit 106. In the ACS unit 106, the branch metrics calculated by the computational unit 105 are added to the corresponding existing path metrics. The new path metrics are compared and the path metric with the highest likelihood is retained as the surviving path. The illustrated ACS unit 106 includes an adder/subtractor 202, a first multiplexer 204, a demultiplexer 206, a minimum register 208, a feedback register 210, a counter 212, a min-index register 214, a general purpose register 216, a second multiplexer 218, and a third multiplexer 220. In one embodiment, the adder/subtractor is 16 bits wide.

In one embodiment of the Viterbi Accelerator 100, the ACS unit 106 includes only a single adder/subtractor 202 in a folded architecture. Advantageously, the single adder/subtractor 202 reduces chip area over the use of multiple adders and subtractors. With a folded architecture, the ACS unit 106 calculates the path metrics in an iterative fashion.

The ACS unit 106 with the folded architecture adds a first branch metric to a first path metric with the adder/subtractor 202, and the ACS unit 106 stores the resulting new path metric in the minimum register 208 through the first multiplexer 204. In a first state, the output of the minimum register 208 and a new branch metric DIN 222 are selected by the second multiplexer 218 and by the third multiplexer 220, respectively, and applied as inputs to the adder/subtractor 202. In a second state, the new branch metric DIN 222 and the output of the feedback register 210 are selected by the second multiplexer 218 and by the third multiplexer 220, respectively, and provided as inputs to the adder/subtractor 202. This allows the adder/subtractor 202 to be reused.

The ACS unit 106 adds a next branch metric to a next path metric with the adder/subtractor 202, and the ACS unit 106 temporarily stores the resulting new path metric in the feedback register 210.

The ACS unit 106 then compares the path metric stored in the minimum register 208 to the path metric stored in the feedback register 210. The presence or absence of an activation of a "carry" signal from the adder/subtractor 202 selects the path with the lower branch metrics. The lower of the two path metrics is retained or stored in the minimum register 208, and an index of the path metric corresponding to the minimum register 208 is stored in the min-index register 214 by loading the contents of the counter 212. The counter 212 is incremented for each computation of path metric, and thus maintains the index of the path metric that is evaluated by the ACS unit 106. When new data is retrieved, the counter 212 and the min-index register 214 are reset by a signal "R." When all the paths are evaluated, the path with the lowest branch metrics is retained in the minimum register 208 and the corresponding index is stored in the min-index register 214.

In addition to the computation of branch metrics, the ACS unit 106 can also be configured to function as a general purpose arithmetic logic unit. For example, an additional data path to the adder/subtractor 202 can allow the ACS unit 106 to calculate 2D and 4D subset errors for a CCITT V.34 communications modem and the like.

In one embodiment, the throughput of the computational unit 105 is increased by merging two levels of radix-2 trellises into one level of a radix-4 trellis, so that two-level operation in the ACS unit 106 can be effectively performed in the time of one radix-4 ACS cycle. Where the cycle time of a radix-4 operation is less than twice the cycle time of a radix-2 operation, the throughput of the ACS unit 106 is improved. Each element in radix-4 decoder calculates four path metrics, selects the smallest one, i.e., the highest likelihood, and stores the result of the selection.

A trace-back method is a backward processing algorithm for deriving the survivor path from a starting state and the path decisions. The survivor memory stores the decisions as to which branch should survive. The state sequence is computed based on the path decisions. A block of M symbols is decoded in reverse order during the data trace-back phase. Thus, a last-in-first-out (LIFO) memory can be used for reversing the order before the information output. Fast hardware implementations have more memory and exhibit a large latency. Instead of tracing back L steps and decoding one symbol, K*L symbols are decoded, where L is the length of the trace-back, and K is between 1 and 1/L.

In one example of an ACS computation, the following steps are carried out:

Step 1: New path decisions are written into memory;

Step 2: A trace back read operation executes for L iterations, such that the survivor sequences are merged to a common path; and Step 3: The common path is scanned by the decoder read operation to retrieve the information bits.

In one embodiment, a zig-zag shift registers-based algorithm is used to update the trellis structure and to make decisions in history. The algorithm updates the trellis structure without trace back mechanisms. In contrast to a conventional trace back technique, which uses a LIFO buffer that occupies a relatively large amount of chip area, one embodiment of the Viterbi Accelerator 100 requires no LIFO buffer and thereby can be fabricated within a relatively small chip area.

For each ACS iteration, new path decisions are written into memory, trace-back read operation executes for L iterations such that the survivor sequences merge to one common path, and the common path is scanned by the decoder read operation to retrieve the information bits.

Figure 3A:
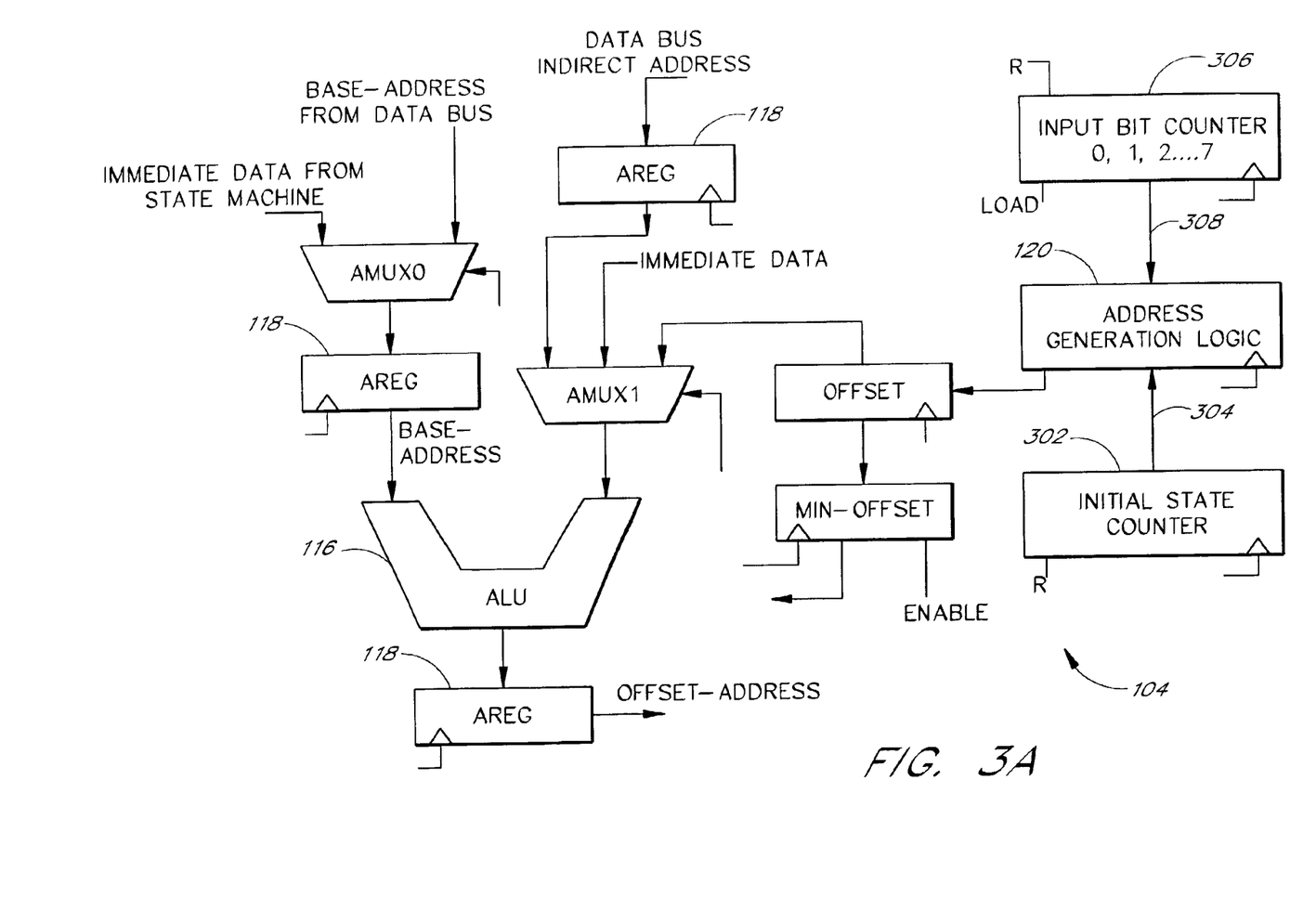
FIG. 3A is an address generation unit according to one embodiment of the invention.

FIG. 3A illustrates one embodiment according to the invention of the address generation unit 104. The address generation unit 104 calculates the address by adding pointers from selected address registers to corresponding offsets for the addresses in the fixed address block 124. In one embodiment, the contents of the fixed address block 124 are programmable by the host processor 156, the algorithmic state machine 102, and the like. In one embodiment, a separate data path is provided to the address generation unit 104 for indirect addressing.

In one embodiment of the address generation unit 104, an initial state counter 302 provides an initial state 304 to the address generation logic unit 120. An input-bit counter 306 generates a state index 308 for a communications protocol such as CCITT V.34 communications and the like.

The previous state is calculated with the initial state counter 302 and the input-bit counter 306, and operating the Viterbi Accelerator 100 in reverse sequence, thereby calculating the previous state dynamically. The previous state is calculated by providing the output of the initial state counter 302 and the output of the input-bit counter 306 as inputs to the address generation logic unit 120 to generate a state index.

In contrast to a conventional decoder that stores sequences in a relatively large memory table, the dynamic computation of reverse sequences advantageously allows the Viterbi Accelerator 100 to efficiently use less memory and also allows relatively simple configuration of the Viterbi Accelerator 100 to a broad range of encoder polynomials.

The address registers 118 contain address pointers for memory allocated to the Viterbi Accelerator 100. Different address pointers are configured through memory which contain the starting address of the different memory blocks for data exchange. Address pointers include an accumulated error buffer pointer, a minimum path buffer pointer, 2D and 4D subset error buffer pointers.

Figure 3B:
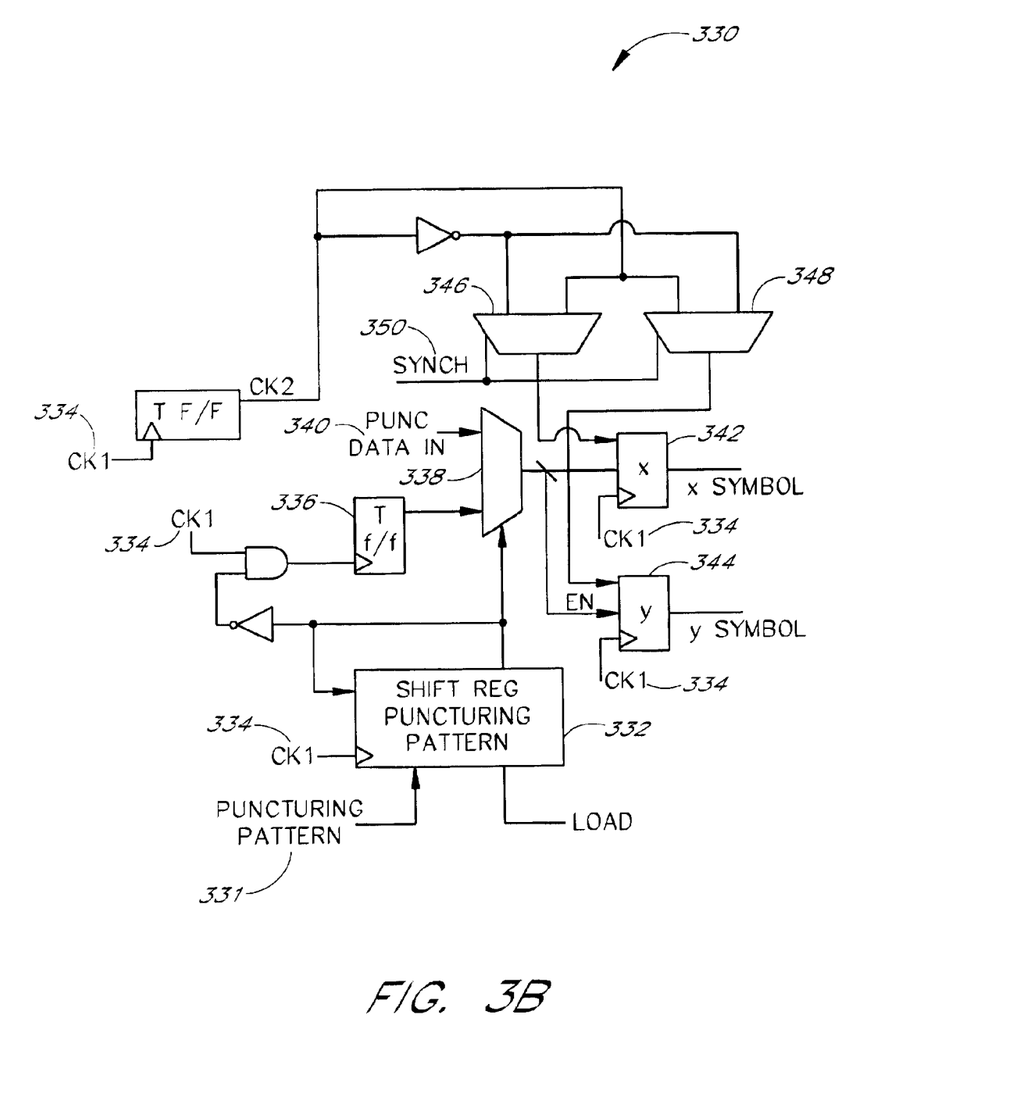
FIG. 3B illustrates one embodiment of a depuncturing unit.

FIG. 3B illustrates a depuncturing unit 330 of a puncturing/depuncturing unit 111. In one embodiment, the depuncturing unit 330 detects deleted symbols and replaces punctured symbols with relatively small positive and negative values alternatively, where null values are not available in the coding schemes prior to decoding with a rate 1/2 decoder. In an alternate embodiment, depuncturing is achieved by inserting null symbols. The null symbols add insignificant bias to the accumulated errors. The trace-back depth increases as the code rate increases. For example, a trace back memory depth of 35 to 40 is typically adequate for code rate 1/2 decoding. However, code rates 3/4 and 7/8 typically use memory depths of 70 and 90, respectively.

A puncturing pattern 331 is loaded to a shift register 332. The puncturing pattern 331 can be loaded by the host processor 156, the algorithmic state machine 102, and the like. The depunctured symbols are generated with the cycles of a first clock 334. For each cycle of the first clock 334, the bits loaded in the shift register 332 shift by one bit. The output of the shift register 332 is applied as an input back to the shift register 332 to allow the puncturing pattern to recycle in the shift register 332.

An inverted output of the shift register is logically ANDed with the first clock 334 and applied as an input to a toggle flip flop 336. The output of the toggle flip flop 336 and a data input 340 are applied as inputs to a first multiplexer 338. The first multiplexer 338 selects between the output of the toggle flip flop 336 and the data input 340 according to the state of the puncture pattern bit that is shifted out of the shift register 332. This allows the depuncturing unit 330 to provide the code from the punctured code, or the null symbol and/or relatively small positive or negative values in accordance with the puncture pattern.

In response to an out-of-synchronization detection, a synch signal 350 changes state, which changes the selected inputs of a second multiplexer 346 and a third multiplexer 348. This allows the relatively low negative value and the relatively low positive value stored in the x-register 342 and the y-register 344 to be interchanged or shuffled.

Figure 4:
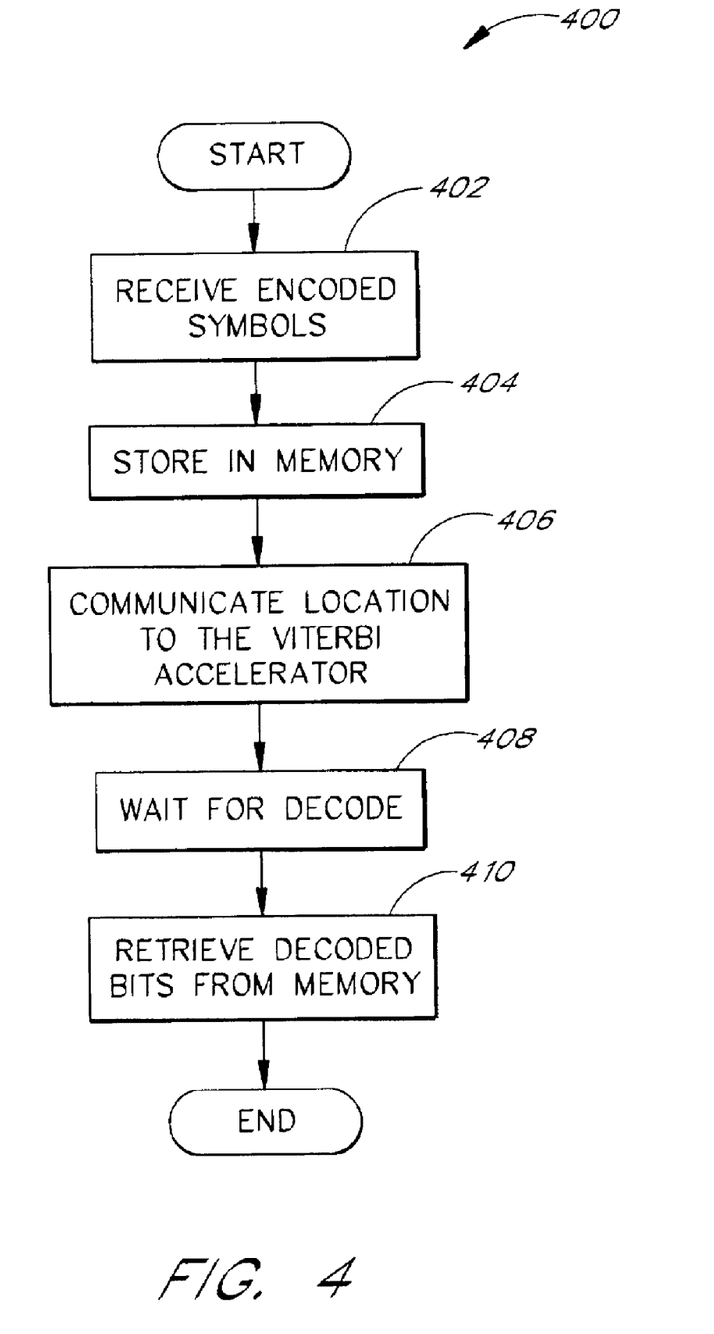
FIG. 4 illustrates a process of interfacing with a Viterbi Accelerator to decode convolutional coding.

FIG. 4 illustrates a process 400 of interfacing with the Viterbi Accelerator 100 to decode convolutional coding. The process begins by receiving (402) encoded symbols. For example, the host processor 156 can receive encoded symbols from the codec 160, which in turn received analog signals from the Data Acquisition Arrangement 162, and so forth.

The received encoded symbols are stored (404) in memory. For example, the host processor 156 can store the received encoded symbols in the shared memory 158. The location or address of the received encoded symbols are communicated (406) to the Viterbi Accelerator 100. This allows the Viterbi Accelerator 100 to retrieve the encoded symbols from the memory in the desired sequence.

The process waits (408) for the Viterbi Accelerator 100 to decode the encoded symbols. Advantageously, while the process waits (408), the process can perform other tasks while the Viterbi Accelerator 100 decodes the encoded symbols in the background. When the Viterbi Accelerator 100 has decoded at least a portion of the encoded symbols, the process reads the decoded results. In one embodiment, the Viterbi Accelerator 100 writes the results back to the memory, such as the shared memory 158, and the process reads the memory to obtain the decoded results.

Figure 5:
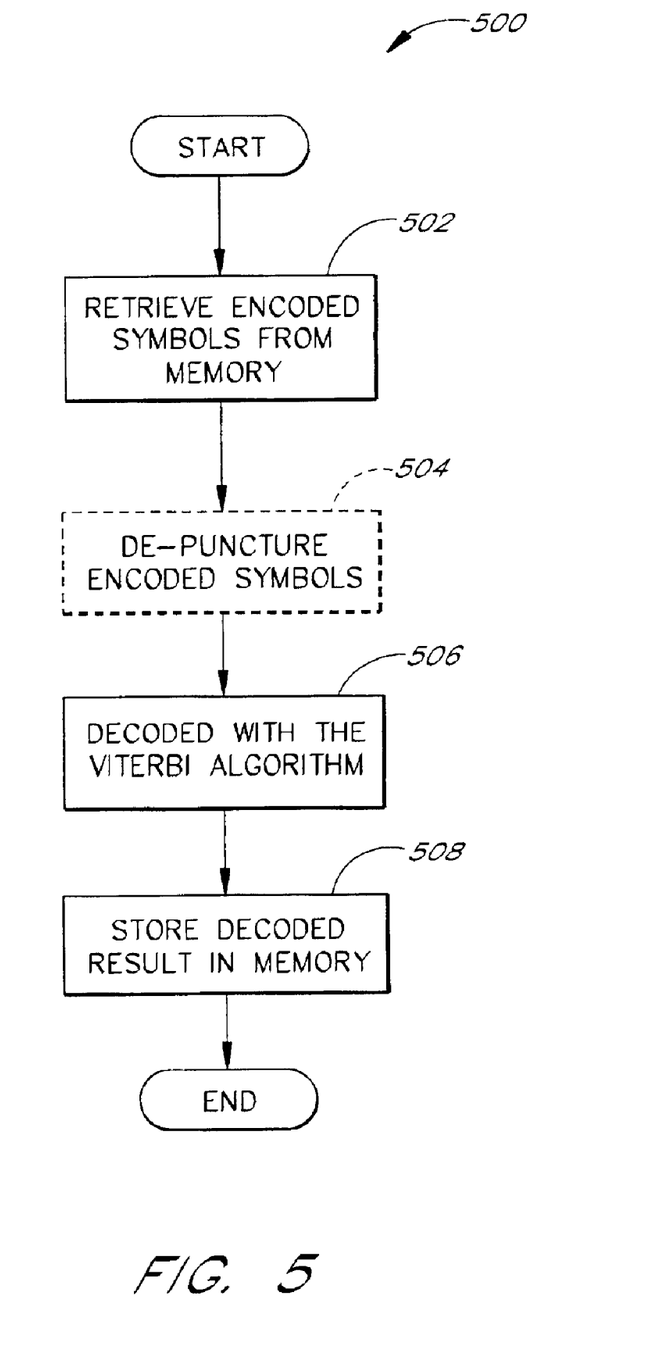
FIG. 5 illustrates a process of decoding convolutional coding with a Viterbi Accelerator.

FIG. 5 illustrates a process 500 of decoding convolutional coding with the Viterbi Accelerator 100. The process retrieves (502) the encoded symbols from memory. Where the encoded symbols have been punctured by the encoder to increase the code rate k/n, the process de-punctures (504) the encoded symbols by, for example, adding null symbols to the encoded symbol sequence. It will be understood by one of ordinary skill in the art that not all convolutionally coded symbol sequences are punctured, so that de-puncturing (504) is not always performed by the process.

The process proceeds to decode (506) the encoded symbols according to the Viterbi algorithm. In one embodiment, the process decodes (506) the convolutional coding without the benefit of a multiplier. The process stores (508) the decoded bits in memory so that the decoded bits are available to another process, such as the process described in connection with FIG. 4. In one embodiment, the process sets an interrupt to the host processor 156 to inform the host processor 156 of the availability of the decoded data.

Figure 6:
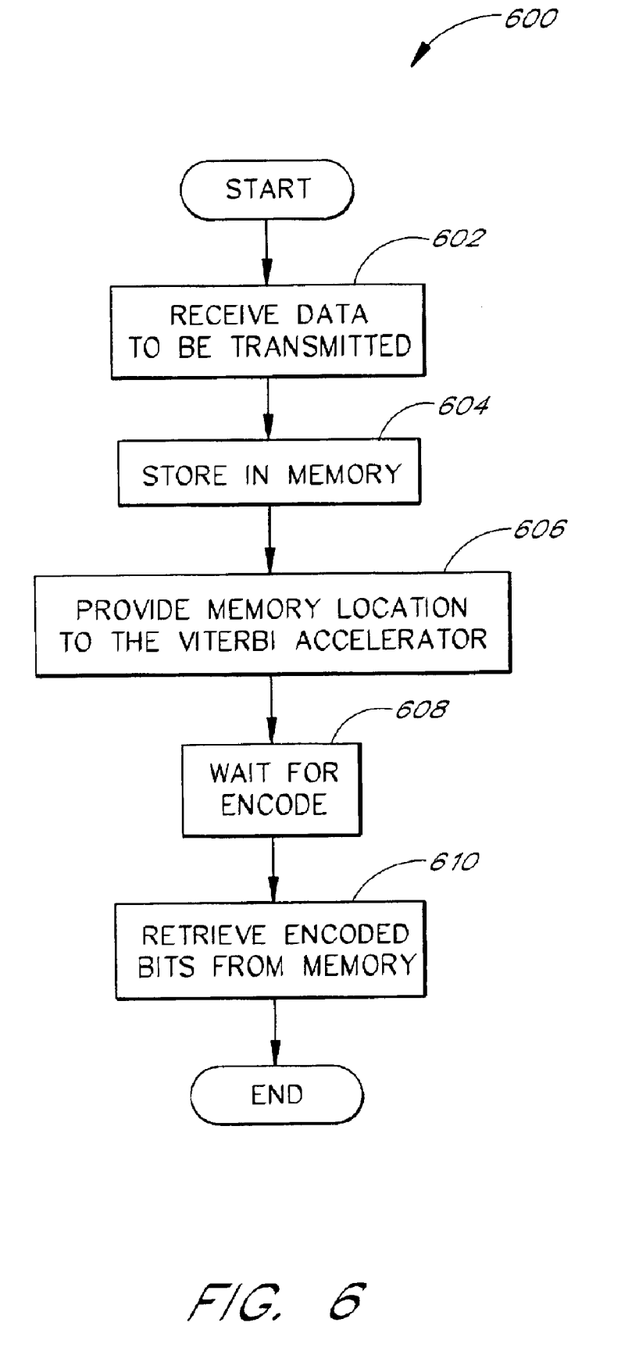
FIG. 6 illustrates a process of interfacing with a Viterbi Accelerator to encode in accordance with convolutional coding.

FIG. 6 illustrates a process 600 of interfacing with the Viterbi Accelerator 100 to encode in accordance with convolutional coding. The process receives (602) data to be encoded and transmitted. For example, the host processor 156 can receive (602) data to be transmitted from the host PC 152. The process stores (604) the received data in memory. The memory, such as the shared memory 158, allows the process to communicate with the Viterbi Accelerator 100. The process further provides (606) the memory location or memory addresses to the Viterbi Accelerator 100 corresponding to where the data was stored (604).

The process waits (608) while the Viterbi Accelerator 100 encodes the data to encoded symbols. Advantageously, the process can perform other unrelated tasks while waiting (608) for the Viterbi Accelerator 100 to encode the data. After the Viterbi Accelerator 100 has encoded at least a portion of the data, the process retrieves (610) encoded symbols from the memory.

Figure 7:
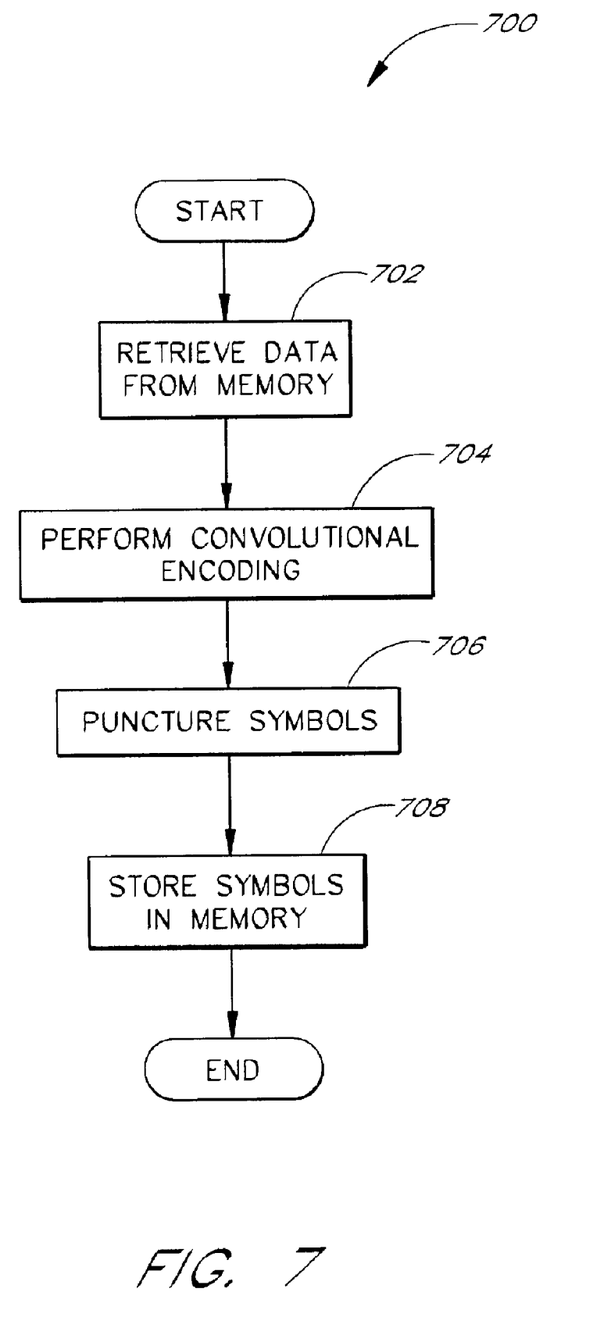
FIG. 7 illustrates a process of encoding convolutional codes with a Viterbi Accelerator.

FIG. 7 illustrates a process 700 of encoding convolutional codes with the Viterbi Accelerator 100. The process retrieves (702) data to be encoded from memory, such as the shared memory 158. The process encodes (704) the data by applying the specified encoder polynomial. Where the encoded symbols are punctured to increase the code rate k/n, the process punctures (706) the symbols by removing selected symbols. The process stores (708) the processed symbols in memory so that the symbols can be retrieved by another process, such as by a process executed by the host processor 156. In one embodiment, the process sets an interrupt to the host processor 156 to inform the host processor 156 of the availability of encoded data.

Although described above in connection with particular embodiments of the invention, it should be understood the descriptions of the embodiments are illustrative of the invention and are not intended to be limiting. Various modifications and applications may occur to those skilled in the art without departing from the true spirit and scope of the invention as defined in the appended claims.

What is claimed is:

1. A communications peripheral adapted to transfer data received from a first system to a second system, the communications peripheral comprising:
   a local interface to the second system;
   a remote interface to the first system;
   a codec coupled to the remote interface, wherein the codec is adapted to convert an analog representation of a first data from the first system to a first digital data;
   a shared memory adapted to temporarily store the first digital data retrieved by a host processor;
   a Viterbi Accelerator adapted to retrieve the first digital data from the shared memory, the Viterbi Accelerator further adapted to decode the first digital data to a second digital data by application of a Viterbi algorithm, the Viterbi Accelerator further adapted to store the second digital data in the shared memory; and
   the host processor coupled to the codec and to the shared memory, wherein the host processor is configured to retrieve the first digital data from the codec and to move the first digital data to the shared memory, where the host processor is further configured to retrieve the second digital data from the shared memory and to provide the second digital data to the second system via the local interface.

2. The communications peripheral as defined in claim 1, wherein:
   the Viterbi Accelerator is further configured to retrieve a third digital data from the shared memory end to convolutionally encode the third digital data to a fourth digital data; and
   the host processor is further configured to receive a third digital data from the second system via the local interface, to transfer the third digital data to the shared memory, to move the fourth digital data from the shared memory to the codec to enable the second system to transfer data to the first system.

3. The communications peripheral as defined in claim 1, wherein the host processor is a digital signal processor.

4. The communications peripheral as defined in claim 1, wherein the communications peripheral is a telephone modem.

5. The communications peripheral as defined in claim 1, wherein the communications peripheral transfers data from the first system to the second system with a wireless connection.

6. The communications peripheral as defined in claim 1, wherein the communications peripheral further includes a bus arbiter that manages access to the shared memory, wherein the bus arbiter provides the host processor with higher priority access to the shared memory than the Viterbi Accelerator.

7. The communications peripheral as defined in claim 1, wherein the Viterbi Accelerator is configured to interrupt the host processor in response to an availability of the second digital data in the shared memory.

8. A decoder for decoding convolutionally encoded data comprising:
   an interface circuit adapted to share a memory device with a host processor, where the interface circuit is further configured to read encoded data from the memory device, and configured to write decoded data to the memory device;

a decoding circuit configured to decode convolutionally encoded data by application of a Viterbi algorithm; and configuration registers adapted to receive initialization parameters from the host processor, and to determine the decoding parameters of the decoder circuit.

9. The decoder as defined in claim 8, further comprising an algorithmic state machine that controls the operation of the decoders wherein the algorithmic state machine is configurable by loading configuration parameters in registers.

10. The decoder as defined in claim 8, wherein the decoding circuit is multiplierless.

11. The decoder as defined in claim 8, wherein the interface circuit accesses the memory device over an address bus and a data bus that is shared with a host processor.

12. A method of decoding convolutionally encoded data, the method comprising:

receiving the convolutionally encoded data into a main processor from a remote computer;

arranging and storing the convolutionally encoded data in a memory device;

instructing a coprocessor to decode the convolutionally encoded data stored in the memory device;

retrieving the convolutionally encoded data from the memory device to the coprocessor;

decoding the convolutionally encoded data to a decoded data; and storing the decoded data in the memory device to make the decoded data available to the main processor.

13. The method as defined in claim 12, further comprising applying a Viterbi algorithm to decode the convolutionally encoded data.

14. The method as defined in claim 12, further comprising setting an interrupt to the main processor in response to decoding at least a portion of the convolutionally encoded data to inform the main processor of the availability of the decoded data.

15. The method as defined in claim 12, further comprising:

selecting coefficients of an encoder polynomial;

storing unencoded data in the memory device;

instructing the coprocessor to encode the unencoded data;

providing a memory location of the unencoded data;

retrieving the unencoded data from the memory device to the coprocessor;

applying the encoder polynomial to the unencoded data to generate a second encoded data; and storing the second encoded data to the memory device.

16. The method as defined in claim 15, further comprising: selecting a puncturing pattern; and applying the puncturing pattern to the second encoded to increase a code rate of the second encoded data.

17. A method of providing data decoded from convolutionally encoded data comprising:

receiving an indication of a memory location of convolutionally encoded data;

retrieving the convolutionally encoded data;

applying a Viterbi algorithm to decode the convolutionally encoded data; storing the decoded data; and setting an interrupt to indicate a readiness of the decoded data.

18. The method as defined in claim 17, wherein the indication of the memory location comprises a pointer to a memory address.

19. The method as defined in claim 17, further comprising: receiving a depuncturing pattern; and inserting null characters to the convolutionally encoded data in response to the depuncturing pattern.

20. The method as defined in claim 17, further comprising:

receiving a depuncturing pattern; and inserting low value numbers to the convolutionally encoded data in response to the depuncturing pattern, wherein the low value numbers alternate from positive to negative.

21. The method as defined in claim 20, wherein the low value numbers are the lowest value numbers that are supported by the computing hardware.

22. A method of configuring a decoder that decodes convolutionally decoded data, the method comprising:

receiving an indication of a code rate, a constraint length, and a puncturing pattern of the convolutionally decoded data; and programing a micro-coded state machine that controls a Viterbi algorithm implemented by the decoder in response to the code rate, the constraint length, and the puncturing pattern.

* * * * *